United States Patent
Muthukrishnan et al.

(10) Patent No.: US 9,627,883 B2
(45) Date of Patent: Apr. 18, 2017

(54) MULTIPLE PORT RF SWITCH ESD PROTECTION USING SINGLE PROTECTION STRUCTURE

(71) Applicant: RF Micro Devices, Inc., Greensboro, NC (US)

(72) Inventors: Swaminathan Muthukrishnan, Greensboro, NC (US); Cody Hale, Browns Summit, NC (US); Randy Naylor, Pepperell, MA (US); Nicholas Liu, Lowell, MA (US)

(73) Assignee: Qorvo US, Inc., Greensboro, NC (US)

( * ) Notice: Subject to any disclaimer, the term of this patent is extended or adjusted under 35 U.S.C. 154(b) by 133 days.

(21) Appl. No.: 13/849,834

(22) Filed: Mar. 25, 2013

(65) Prior Publication Data
US 2013/0215808 A1    Aug. 22, 2013

Related U.S. Application Data

(63) Continuation-in-part of application No. 13/446,697, filed on Apr. 13, 2012.
(Continued)

(51) Int. Cl.
*H02H 9/04* (2006.01)
*H01L 27/02* (2006.01)

(52) U.S. Cl.
CPC ......... *H02H 9/045* (2013.01); *H01L 27/0274* (2013.01); *H01L 27/0292* (2013.01); *H02H 9/046* (2013.01)

(58) Field of Classification Search
CPC .... H02H 9/046; H02H 9/045; H01L 27/0266; H01L 27/0251; H01L 27/0255; H01L 27/0262
See application file for complete search history.

(56) References Cited

U.S. PATENT DOCUMENTS 6,946,891 B2    9/2005 Asano et al.
7,102,862 B1    9/2006 Lien et al.
(Continued)

FOREIGN PATENT DOCUMENTS

JP    2009-232137    * 10/2009

OTHER PUBLICATIONS

Chen, Yuh-Yue et al., "ESD Considerations for SOI Switch Design," IEEE International SOI Conference, Oct. 2011, pp. 1-2.
(Continued)

*Primary Examiner* — Rexford Barnie
*Assistant Examiner* — Terrence Willoughby
(74) *Attorney, Agent, or Firm* — Withrow & Terranova, P.L.L.C.

(57) ABSTRACT

Antenna switching circuitry comprises a plurality of communication ports, an antenna port, a plurality of switches, and an ESD protection device. The plurality of switches are adapted to selectively couple one or more of the communication ports to the antenna port in order to transmit or receive a signal. The ESD protection device is coupled between one of the plurality of communication ports and ground, and is adapted to form a substantially low impedance path to ground during an ESD event. Upon the occurrence of an ESD event, a received electrostatic charge passes through one or more of the plurality of switches to the ESD protection device, where it is safely diverted to ground. By using only one ESD protection device, desensitization of the antenna switching circuitry due to the parasitic loading of the ESD protection device is avoided. Further, the area of the antenna switching circuitry is minimized.

20 Claims, 20 Drawing Sheets

Related U.S. Application Data

(60) Provisional application No. 61/737,466, filed on Dec. 14, 2012, provisional application No. 61/788,652, filed on Mar. 15, 2013, provisional application No. 61/474,930, filed on Apr. 13, 2011.

(56) References Cited

U.S. PATENT DOCUMENTS

| | | | |
|---|---|---|---|
| 7,199,635 | B2 | 4/2007 | Nakatsuka et al. |
| 7,328,041 | B2* | 2/2008 | Tasaka ................. 455/552.1 |
| 7,881,030 | B1 | 2/2011 | Li et al. |
| 2001/0015437 | A1* | 8/2001 | Ishii et al. ................. 257/12 |
| 2001/0040479 | A1 | 11/2001 | Zhang |
| 2005/0275031 | A1 | 12/2005 | Dournelle et al. |
| 2005/0285143 | A1 | 12/2005 | Asano |
| 2007/0049352 | A1* | 3/2007 | Nakajima ............ H04B 1/006 455/571 |
| 2008/0218927 | A1* | 9/2008 | Harada et al. ............. 361/119 |
| 2009/0086394 | A1 | 4/2009 | Yasuda et al. |
| 2010/0001347 | A1 | 1/2010 | Sugiura |
| 2011/0092246 | A1* | 4/2011 | Ginsburg et al. ......... 455/550.1 |
| 2012/0040632 | A1* | 2/2012 | Mikhemar ............ H01L 23/60 455/217 |
| 2014/0327048 | A1 | 11/2014 | Chow et al. |

OTHER PUBLICATIONS

Kohama, K. et al., "An Antenna Switch MMIC for GSM/UMTS Handsets Using E/D-Mode JPHEMT Technology," Radio Frequency Integrated Circuits (RFIC) Symposium, Jun. 12-14, 2005, pp. 509-512.

Muthukrishnan, Swaminathan et al., "A Novel On-Chip Protection Circuit for RFICs Implemented in D-mode pHEMT Technology," 29th Electrical Overstress/Electrostatic Discharge Symposium, Sep. 16-21, 2007, pp. 4A.3-1-4A.3-7.

Muthukrishnan, Swaminathan et al., "A Novel Clamp Based ESD Protection Structure for High Power RF Ports in GaAs pHEMT Process," IEEE Compound Semiconductor IC Symposium Digest, Oct. 2011, pp. 83-86.

Non-Final Office Action for U.S. Appl. No. 13/446,697, mailed Aug. 17, 2015, 10 pages.

Advisory Action for U.S. Appl. No. 13/446,697, mailed May 19, 2016, 3 pages.

Non-Final Office Action for U.S. Appl. No. 13/446,697, mailed Jul. 5, 2016, 16 pages.

Final Office Action for U.S. Appl. No. 13/446,697, mailed Mar. 3, 2016, 13 pages.

Non-Final Office Action for U.S. Appl. No. 13/446,697, mailed Dec. 19, 2016, 10 pages.

\* cited by examiner

MULTIPLE PORT RF SWITCH ESD PROTECTION USING SINGLE PROTECTION STRUCTURE

RELATED APPLICATIONS

This application claims the benefit of U.S. provisional patent application Ser. No. 61/737,466, filed Dec. 14, 2012, and U.S. provisional patent application Ser. No. 61/788,652, filed Mar. 15, 2013, the disclosures of which are hereby incorporated herein by reference in their entirety.

This application claims priority to and is a continuation-in-part of U.S. patent application Ser. No. 13/446,697 filed Apr. 13, 2012, entitled "CLAMP BASED ESD PROTECTION CIRCUITS," which claims priority to U.S. provisional patent application Ser. No. 61/474,930, filed Apr. 13, 2011, the disclosures of which are hereby incorporated by reference in their entirety.

FIELD OF THE DISCLOSURE

The present disclosure relates to electrostatic discharge (ESD) protection circuitry, and specifically to the use of ESD protection circuitry in a mobile terminal.

BACKGROUND

A mobile terminal generally includes antenna switching circuitry for selectively coupling one of a plurality of communication ports to an antenna port in order to transmit or receive a signal. The antenna switching circuitry within a mobile terminal is often prone to receiving electrostatic discharge (ESD). When the received ESD reaches a level high enough to cause damage to the mobile terminal, an ESD event is said to occur. An ESD event may occur due to contact with a user of the mobile terminal, contact with a charged surface, or charge transfer from a nearby electromagnetic field. Because the antenna switching circuitry is coupled to the antenna, the front end receive circuitry, and the front end transmit circuitry within the mobile terminal, an ESD event received at the antenna switching circuitry can cause catastrophic damage to the mobile terminal. Accordingly, ESD protection devices are often included within the antenna switching circuitry to avoid damage to the mobile terminal as a result of an ESD event.

Generally, ESD protection devices are connected to the antenna switching circuitry in a shunt configuration, and are adapted to form a substantially low impedance path to ground during an ESD event in order to safely divert the ESD away from the antenna switching circuitry to ground. FIG. 1 is a schematic representation of antenna switching circuitry 10 including a conventional ESD protection scheme. The antenna switching circuitry 10 includes an antenna port 12, a plurality of communication ports 14, a plurality of switches 16, and a plurality of ESD protection devices 18. For context, an antenna 20 is also shown. The plurality of switches 16 within the antenna switching circuitry 10 are adapted to selectively couple one or more of the communication ports 14 to the antenna port 12 in order to facilitate the transmission and reception of signals.

As shown in FIG. 1, an ESD protection device 18 is coupled to each communication port in the plurality of communication ports 14 in the antenna switching circuitry 10. Accordingly, upon the occurrence of an ESD event on any one of the communication ports 14, the ESD protection device 18 associated with the affected port will safely divert the ESD signal to ground. While effective at protecting a mobile terminal in which the antenna switching circuitry 10 is integrated from damage due to an ESD event, use of the conventional ESD protection scheme may significantly degrade the performance of the antenna switching circuitry 10 and the mobile terminal. Using a separate ESD protection device 18 for each communication port in the plurality of communication ports 14 also consumes a large amount of real estate, thereby increasing the size and cost of the antenna switching circuitry 10. Further, certain communication nodes within the antenna switching circuitry 10 are highly sensitive to distortion, and may be rendered unusable due to the parasitic loading of the connected ESD protection device 18.

Accordingly, ESD protection circuitry is needed that is capable of protecting a mobile terminal from damage due to an ESD event while minimizing the area and parasitic loading introduced by the ESD protection circuitry.

SUMMARY

Antenna switching circuitry comprises a plurality of communication ports, an antenna port, a plurality of switches, and an electrostatic discharge (ESD) protection device. The plurality of switches are adapted to selectively couple one or more of the communication ports to the antenna port in order to transmit or receive a signal. The ESD protection device is coupled between one of the plurality of communication ports and ground, and is adapted to form a substantially low impedance path to ground during an ESD event, while maintaining a substantially high impedance during the non-occurrence of an ESD event in order to minimize signal loss as a result of the ESD device. Upon the occurrence of an ESD event, a received electrostatic charge passes through one or more of the plurality of switches to the ESD protection device, where it is safely diverted to ground. Accordingly, the antenna switching circuitry, as well as any connected circuitry, is protected from damage as a result of the ESD event. By using only one ESD protection device, desensitization of the antenna switching circuitry due to the parasitic loading of the ESD protection device is avoided. Further, the area of the antenna switching circuitry is minimized.

According to one embodiment, the ESD protection device is coupled to the communication port in the plurality of communication ports that receives the lowest power signal. Accordingly, desensitization of the antenna switching circuitry due to the parasitic loading of the ESD protection device is further avoided.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
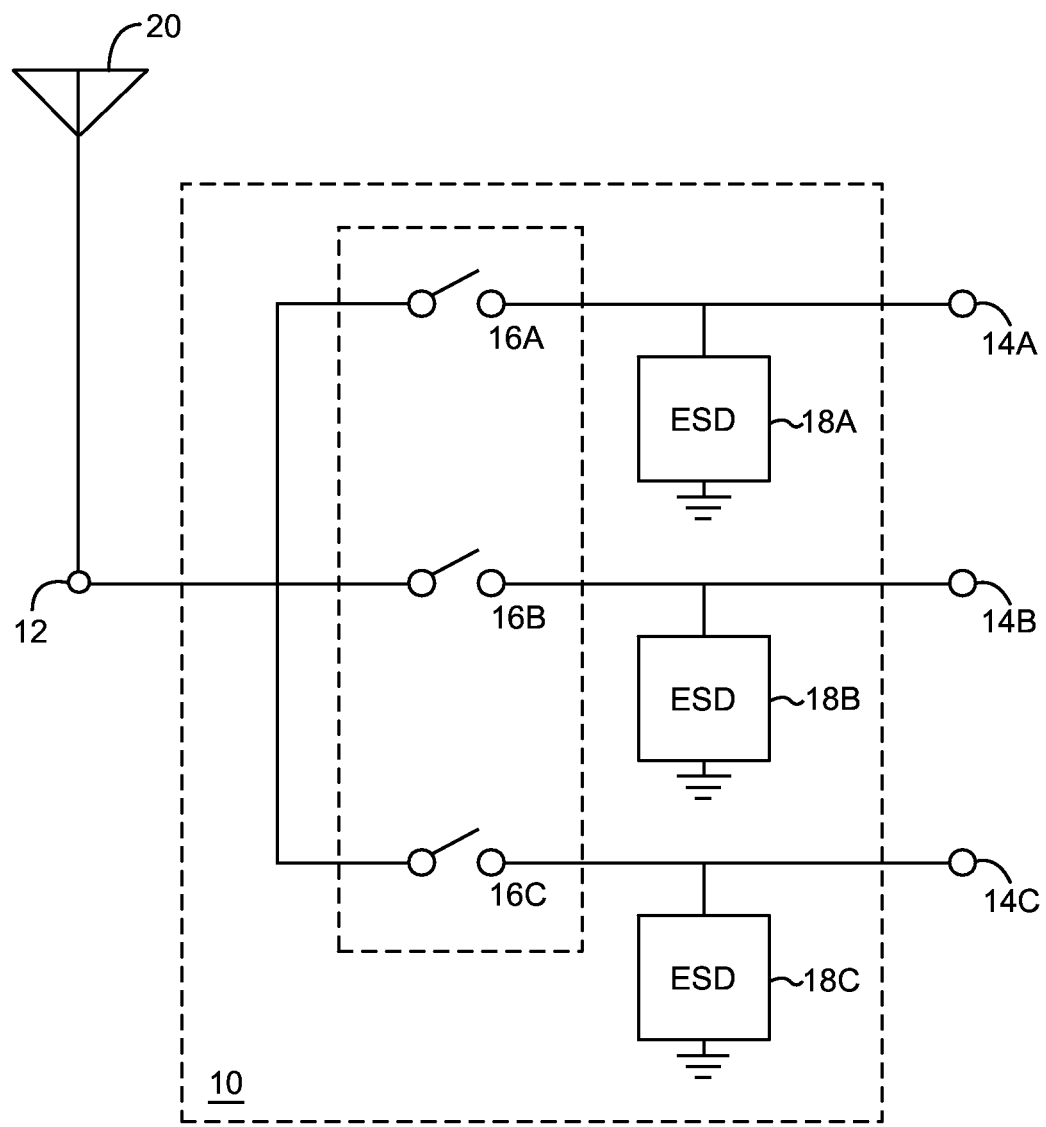
FIG. 1 shows related art antenna switching circuitry including a conventional ESD protection scheme.
Figure 2:
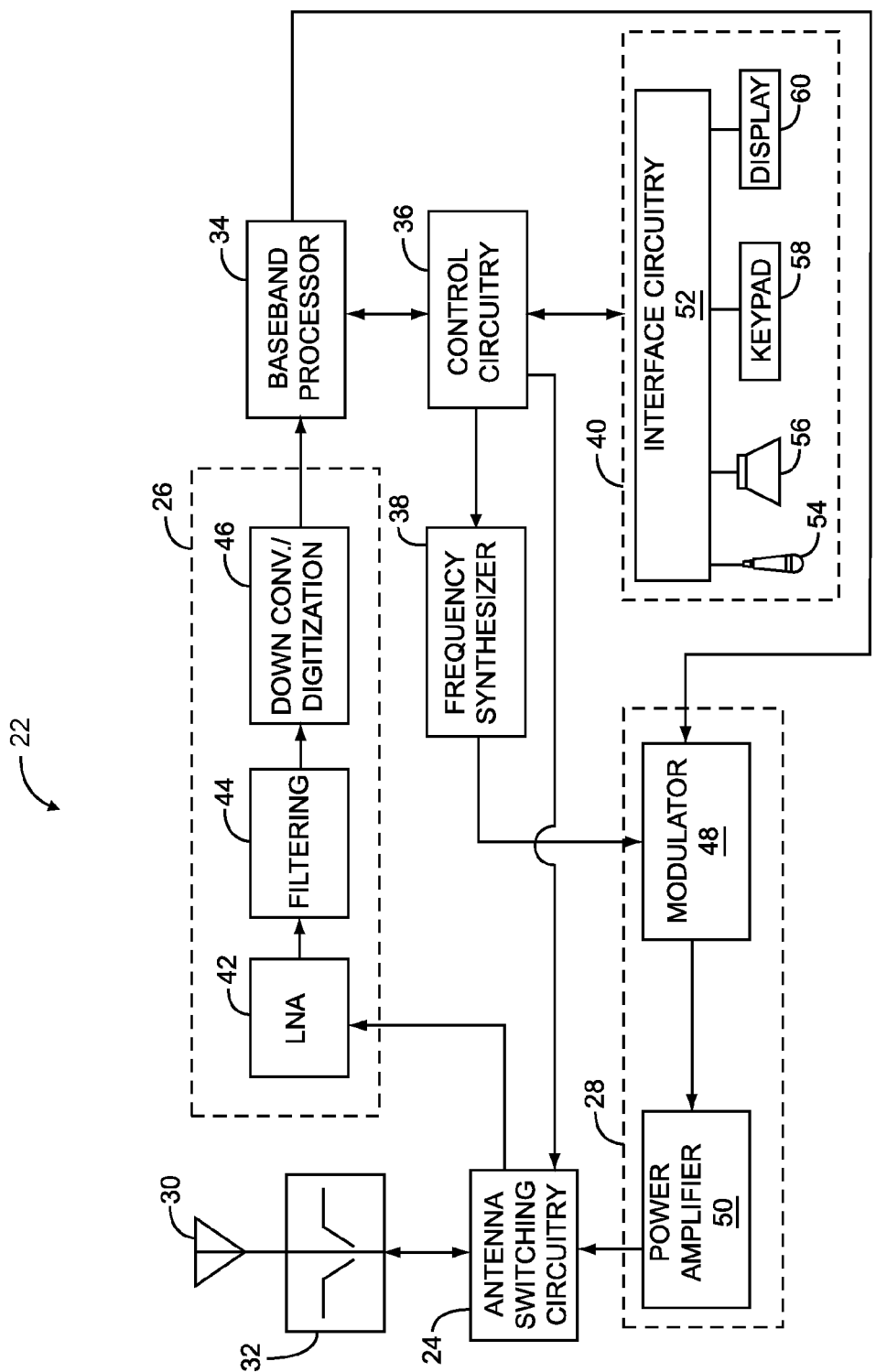
FIG. 2 shows a block diagram of a mobile terminal.

Turning now to FIG. 2, the basic architecture of a mobile terminal 22 including antenna switching circuitry 24 is shown. The mobile terminal 22 may include a receiver front end 26, a radio frequency transmitter section 28, an antenna 30, a diplexer 32, a baseband processor 34, a control system 36, a frequency synthesizer 38, and an interface 40. In a receive mode of operation, the antenna 30 receives information bearing radio frequency signals from one or more remote transmitters provided by a base station (not shown). The radio frequency signals are delivered to the diplexer 32, where they are separated into their low and high frequency components and delivered to the antenna switching circuitry 24. The antenna switching circuitry 24 selectively places one or more terminals of the diplexer 32 into communication with one or more terminals of low noise amplifier circuitry 42 within the receiver front end 26. The low noise amplifier circuitry 42 amplifies the radio frequency signal, and delivers the signal to filtering circuitry 44. The filtering circuitry 44 minimizes broadband interference in the received radio frequency signal, while down conversion and digitization circuitry 46 down convert the filtered, received radio frequency signal into an intermediate or baseband frequency signal, which is then digitized into one or more digital streams. The receiver front end 26 typically uses one or more mixing frequencies generated by the frequency synthesizer 38. The baseband processor 34 is generally implemented in one or more digital signal processors (DSPs).

On the transmit side, the baseband processor 34 receives digitized data, which may represent voice, data, or control information, from the control system 36, which it encodes for transmission. The encoded data is output to the radio frequency transmitter section 28, where it is used by a modulator 48 to modulate a carrier signal at a desired transmit frequency. Power amplifier circuitry 50 amplifies the modulated carrier signal to a level appropriate for transmission, and delivers the amplified and modulated carrier signal to the antenna switching circuitry 24. The antenna switching circuitry 24 selectively couples one or more terminals of the power amplifier circuitry 50 with one or more terminals of the diplexer 32 in order to deliver the amplified and modulated carrier signal to the antenna 30.

A user may interact with the mobile terminal 22 via the interface 40, which may include interface circuitry 52 associated with a microphone 54, a speaker 56, a keypad 58, and a display 60. The interface circuitry 52 typically includes analog-to-digital converters, digital-to-analog converters, amplifiers, and the like. Additionally, it may include a voice encoder/decoder, in which case it may communicate directly with the baseband processor 34. The microphone 54 will typically convert audio input, such as the user's voice, into an electrical signal, which is then digitized and passed directly or indirectly to the baseband processor 34. Audio information encoded in the received signal is recovered by the baseband processor 34, and converted by the interface circuitry 52 into an analog signal suitable for driving the speaker 56. The keypad 58 and the display 60 enable the user to interact with the mobile terminal 22, input numbers to be dialed, access address book information, or the like, as well as monitor call progress information.

Figure 3:
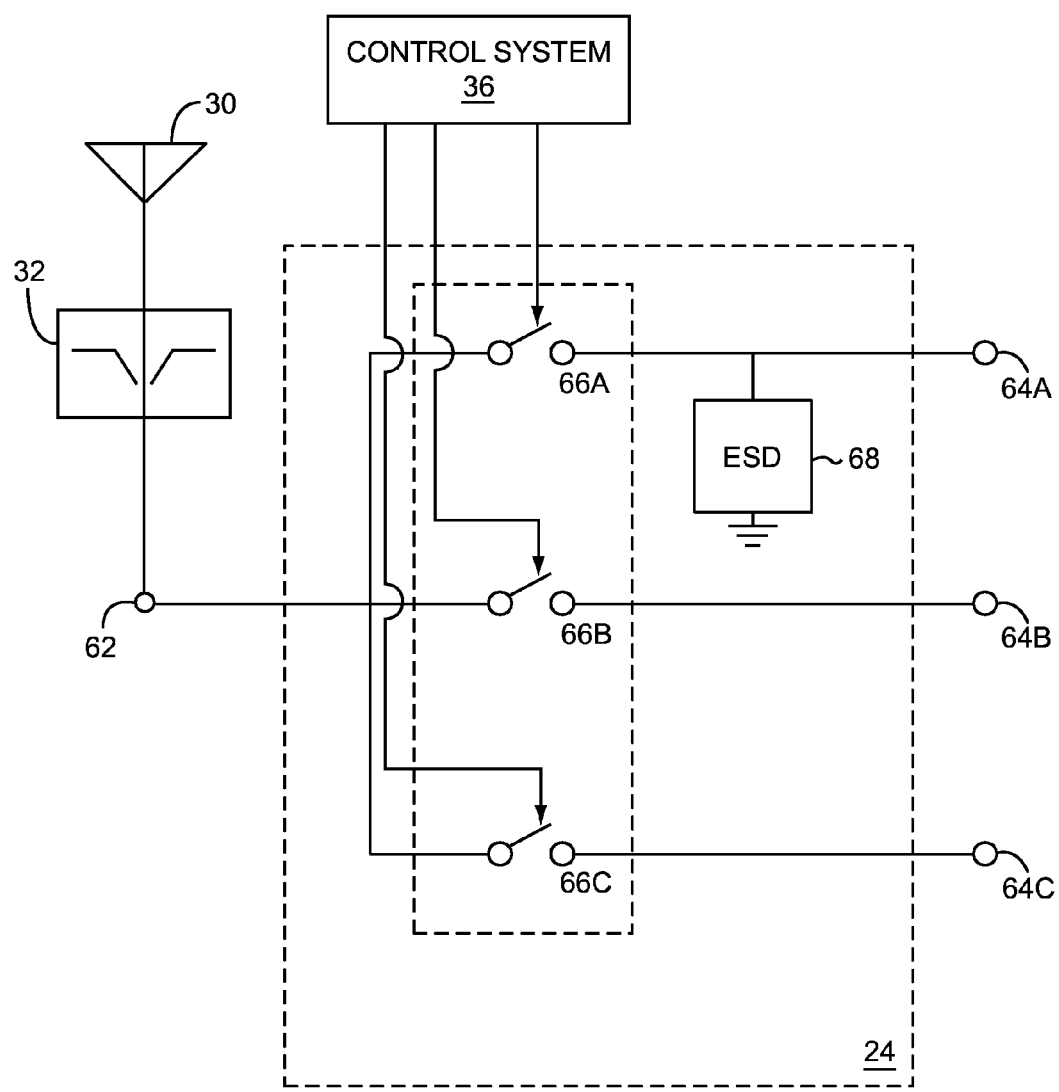
FIG. 3 shows a schematic representation of antenna switching circuitry employing a novel ESD protection scheme according to the present disclosure.

FIG. 3 shows details of the antenna switching circuitry 24 shown in FIG. 2. As shown in FIG. 3, the antenna switching circuitry 24 includes an antenna port 62, a plurality of communication ports 64, a plurality of switches 66, and an ESD protection device 68. For context, the diplexer 32, the antenna 30, and the control system 36 are also shown. The plurality of switches 66 may include a first switch 66A, a second switch 66B, and a third switch 66C connected to form a single pole three throw (SP3T) switch. Each one of the plurality of switches 66 may be adapted to selectively couple one or more of the plurality of communication ports 64 to the antenna port 62 in order to facilitate the transmission or reception of signals. The ESD protection device 68 is coupled between one of the plurality of communication ports 64 and ground, and is adapted to form a substantially low impedance path to ground during an ESD event in order to divert the received ESD signal away from the antenna switching circuitry 24 to ground, while maintaining a substantially high impedance at all other times in order to minimize signal loss as a result of the ESD protection device 68. Although the ESD protection device 68 is shown coupled between the first communication port 64A and ground, the ESD protection device 68 may be coupled to any one of the plurality of communication ports 64 without departing from the principles of the present disclosure. Further, although a single pole three throw (SP3T) switch 66 is shown in FIG. 3, the antenna switching circuitry 24 may comprise any number of switches, including any number of poles and throws, without departing from the principles of the present disclosure.

According to one embodiment, the ESD protection device 68 is coupled to the least sensitive communication port in the plurality of communication ports 64. Accordingly, effects on the performance of the antenna switching circuitry 24 as a result of the parasitic loading of the ESD protection device 68 are minimized. The least sensitive communication port in the plurality of communication ports may be, for example, the communication port that receives the lowest power signal. This is because a lower power signal will be less affected by the parasitic loading of the ESD protection device than a high power signal.

According to one embodiment, more than one ESD protection device 68 is used in the antenna switching circuitry 24. However, the number of ESD protection devices is less than the number of communication ports 64. By reducing the number of ESD protection devices, effects on the performance of the antenna switching circuitry 24 as a result of the ESD protection circuitry are mitigated.

Figure 4:
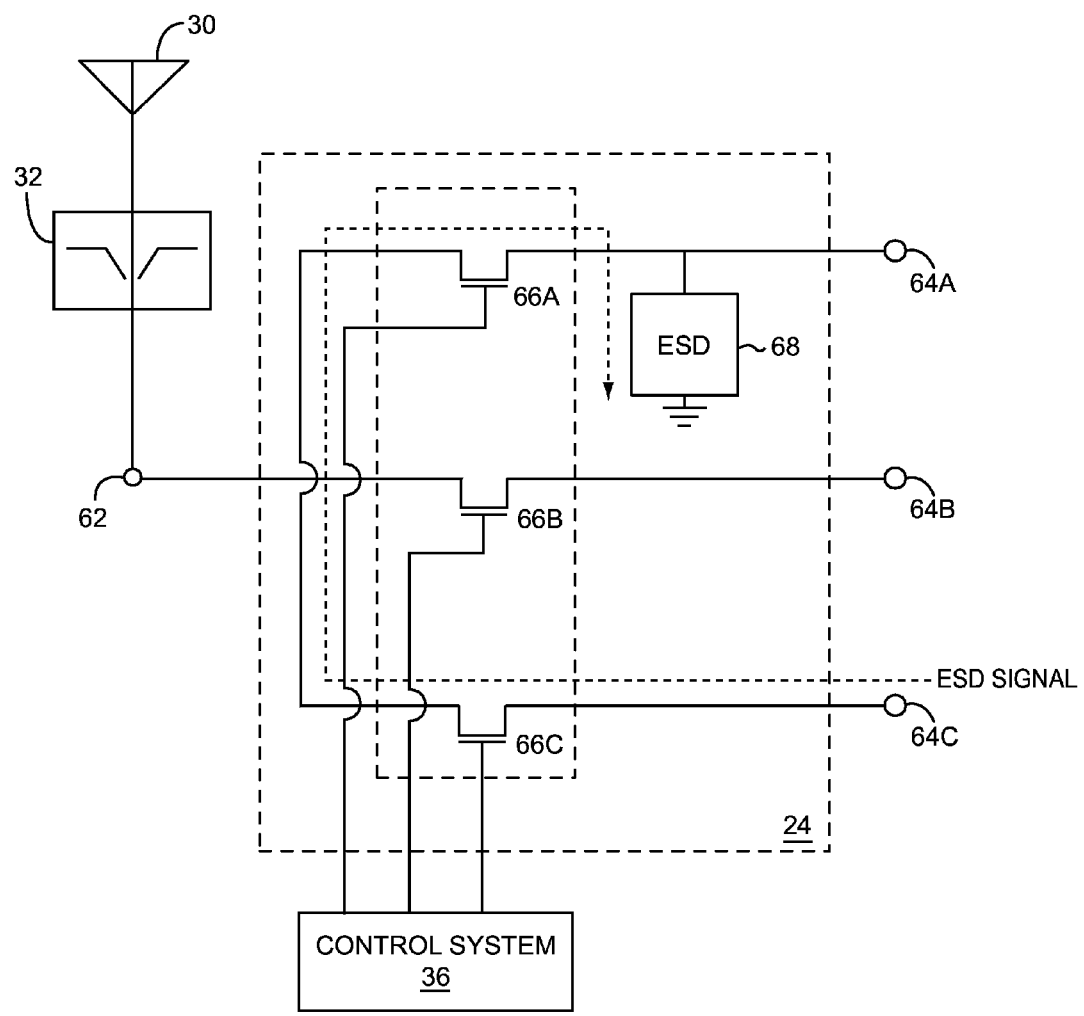
FIG. 4 illustrates the operation of the antenna switching circuitry shown in FIG. 3.

FIG. 4 shows operation of the antenna switching circuitry 24 during a an ESD event. When a positive ESD event (e.g., an ESD event comprising a positive voltage) is received at the third communication port 64C in the plurality of communication ports 64, the ESD signal will travel to the third switch 66C in the plurality of switches 66. According to one embodiment, each one of the switches in the plurality of switches 66 is a depletion mode field effect transistor (FET) having a drain contact, a gate contact, and a source contact, although any switching device may be used without departing from the principles of the present disclosure. When the ESD signal is received at the third switch 66C, the drain-to-source voltage of the third switch 66C increases. At this time, the gate-to-drain voltage remains below the pinchoff voltage of the switch. Accordingly, because a depletion mode FET remains in an off state while the gate-to-drain voltage is below the pinchoff voltage, the third switch 66C remains in an off state. As the voltage across the third switch 66C increases, eventually the drain-to-gate breakdown voltage is exceeded. Due to the extremely short duration of the ESD event, the breakdown is non-catastrophic, and the third switch 66C remains operational. The breakdown results in current flow through the gate of the third switch 66C, which in turn increases the gate-to-drain voltage. Eventually, the gate-to-drain voltage exceeds the pinchoff voltage of the third switch 66C, and the third switch 66C enters into an on state.

Once the third switch enters into an on state, the ESD signal flows through the third switch 66C to the first switch 66A in the plurality of switches 66. A similar process to that described above occurs with respect to the first switch 66A, and the ESD signal passes through the first switch 66A to the ESD protection device 68. Once present at the ESD protection device 68, the ESD signal is safely diverted to ground, as will be discussed in further detail below.

When a negative ESD event (e.g., an ESD event comprising a negative voltage) is received at the third communication port 64C in the plurality of communication ports 64, the ESD signal will travel to the third switch 66C in the plurality of switches 66. According to one embodiment, each one of the switches in the plurality of switches 66 is a depletion mode FET having a drain contact, a gate contact, and a source contact, although any switching device may be used without departing from the principles of the present disclosure. When the ESD signal is received at the third switch 66C, the drain-to-source voltage of the third switch 66C decreases. At this time, the gate-to-drain voltage remains above the pinchoff voltage of the switch. Accordingly, because a depletion mode FET remains in an on state while the gate-to-drain voltage is above the pinchoff voltage, the third switch 66C remains in an on state. Because the third switch 66C is in an on state, the ESD signal is passed through the third switch 66C to the first switch 66A, as described above. Once again, the first switch 66A remains in an on state, and the ESD signal is passed to the ESD protection device 68, where it is safely diverted to ground, as will be discussed in further detail below.

Figure 5:
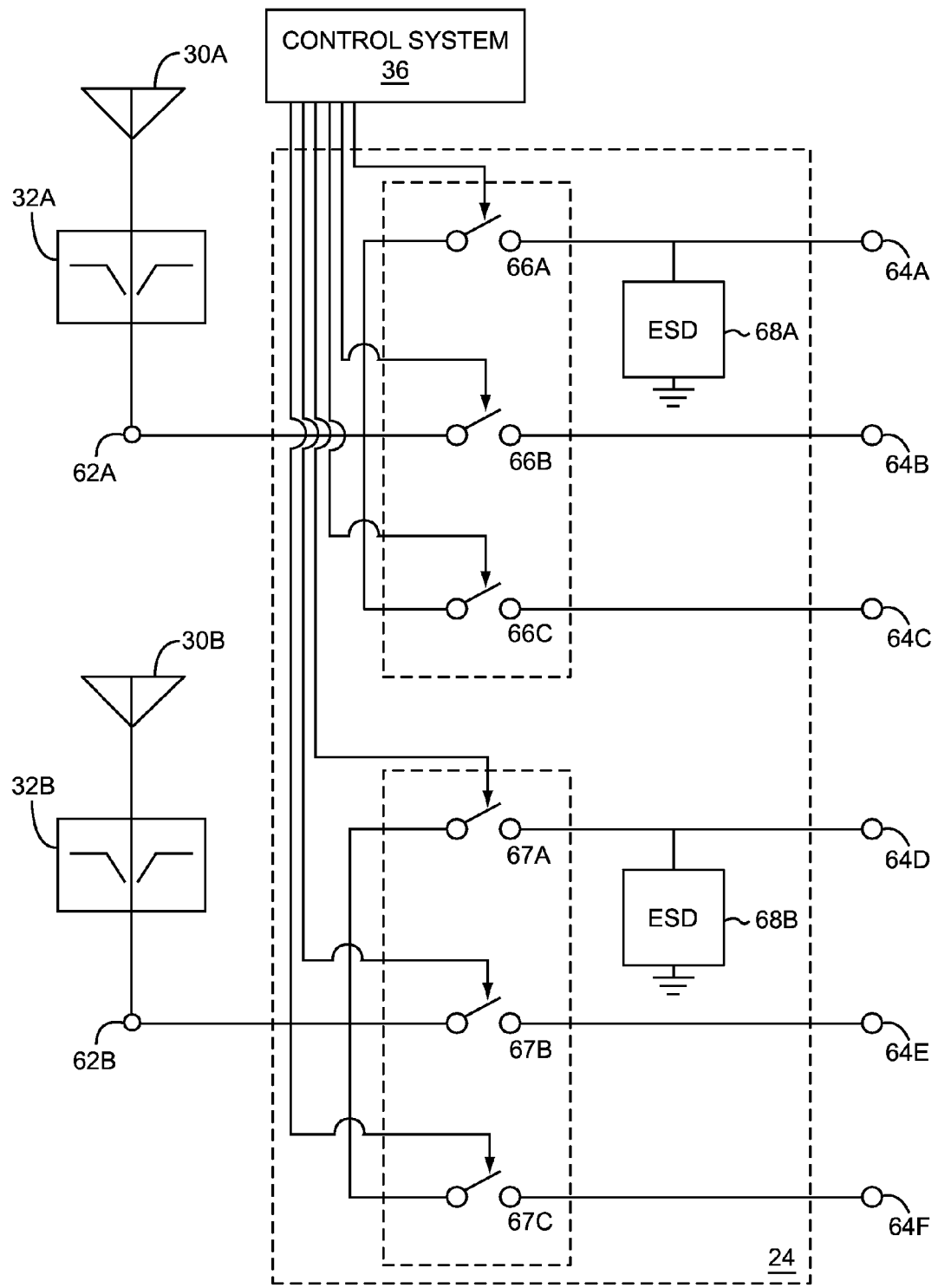
FIG. 5 shows an alternative embodiment of antenna switching circuitry employing a novel ESD protection scheme according to the present disclosure.

FIG. 5 shows details of the antenna switching circuitry 24 shown in FIG. 2 according to an alternative embodiment of the present disclosure. According to this embodiment, the antenna switching circuitry 24 is adapted for use with two antennas, and includes a first antenna port 62A, a second antenna port 62B, a first plurality of communication ports 64A-64C, a second plurality of communication ports 64D-64F, a first plurality of switches 66, a second plurality of switches 67, a first ESD protection device 68A, and a second ESD protection device 68B. For context, a first diplexer 32A, a second diplexer 32B, a first antenna 30A, a second antenna 30B, and the control system 36 are also shown.

The first plurality of switches 66 may include a first switch 66A, a second switch 66B, and a third switch 66C connected to form a single pole three throw (SP3T) switch. Each one of the switches in the first plurality of switches 66 may be adapted to selectively couple one or more of the first plurality of communication ports 64A-64C to the first antenna port 62A in order to facilitate the transmission and reception of signals at the first antenna 30A. The second plurality of switches 66B may include a first switch 67A, a second switch 67B, and a third switch 67C connected to form a single pole three throw (SP3T) switch. Each one of the switches in the second plurality of switches 67 may be adapted to selectively couple one or more of the second plurality of communication ports 64D-64F to the second antenna port 62B in order to facilitate transmission and reception of signals at the second antenna 30B.

The first ESD protection device 68A is coupled between one of the first plurality of communication ports 64A-64C and ground, and is adapted to form a substantially low impedance path to ground during an ESD event in order to divert the received ESD signal away from the first plurality of switches 66A to ground, while maintaining a substantially high impedance at all other times in order to minimize signal loss as a result of the first ESD protection device 68A.

The second ESD protection device 68B is coupled between one of the second plurality of communication ports 64D-64F and ground, and is adapted to form a substantially low impedance path to ground during an ESD event in order to divert the received ESD signal away from the second plurality of switches 66B to ground, while maintaining a substantially high impedance at all other times in order to minimize the signal loss as a result of the second ESD protection device 68B. Because the first plurality of switches 66A and the second plurality of switches 66B are not connected, an ESD protection device 68 is required for each one of the first plurality of switches 66A and the second plurality of switches 66B.

Figure 6A:
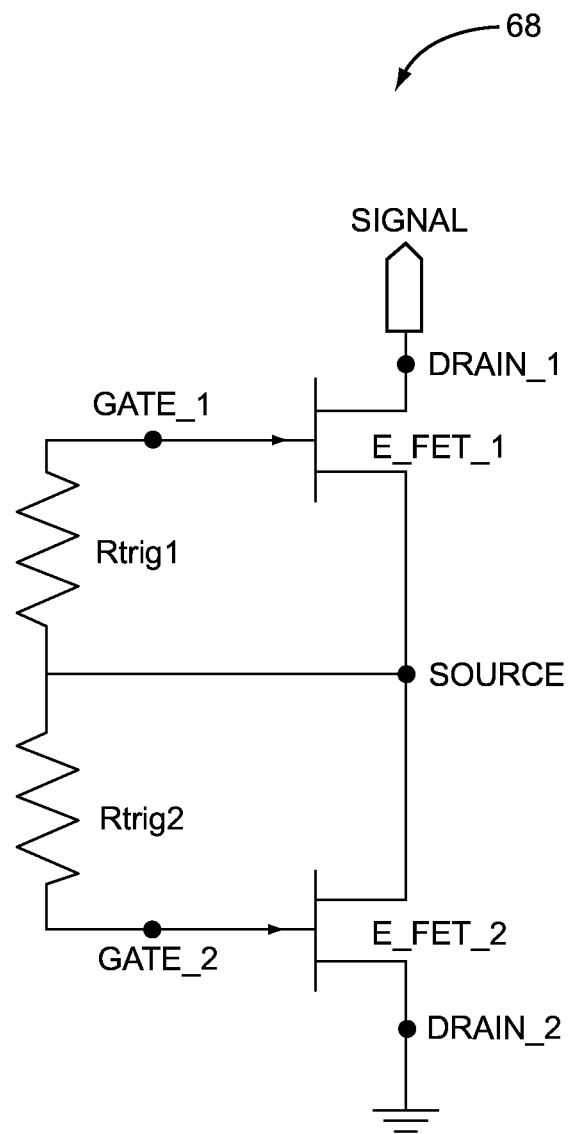
FIG. 6A is an illustrative dual clamp schematic.

FIG. 6A shows details of the ESD protection device 68 shown in FIGS. 3 and 4 according to one embodiment of the present disclosure. The structure of the ESD protection device 68 (Dual E-clamp) includes two pHEMT clamps connected in back to back configuration. Each clamp consists of an E-mode Field Effect Transistor (E_FET) with a resistor ($R_{trig}$) connected between gate and source.

Specifically, the first transistor E_FET_1 is defined by three nodes: DRAIN_1, GATE_1, and SOURCE. The second transistor E_FET_2 is defined by three nodes: DRAIN_2, GATE_2, and SOURCE. Note that SOURCE is a common node which serves as the source for the first transistor and as the source for the second transistor in a two FET back-to-back configuration.

Regarding the first transistor, DRAIN_1 serves as an input node for an RF port labeled SIGNAL. The DRAIN_1 node is connected to the RF port labeled SIGNAL that needs to be ESD protected. A first trigger resistor Rtrig1 connects GATE_1 to SOURCE. The node SOURCE is a common source connecting the source of the first transistor to the source of the second transistor.

Regarding the second transistor, DRAIN_2 is connected to ground. Additional transistors may be placed in series with the first and second transistor (see FIGS. 12A and 12D). A second trigger resistor Rtrig2 connects GATE_2 to SOURCE. Again, the node SOURCE is a common source connecting the source of the first transistor to the source of the second transistor.

During normal operation (no ESD events), the clamp is OFF, and no current (except a very small leakage current) flows through the clamp. An RF processing circuit associated with the clamp (and connected to the SIGNAL input) operates normally, with only a slight effect from the small leakage current and from the capacitance of the clamp. For example, the associated circuit may be a switch or may be a power amplifier. The working principles during positive and negative ESD events are depicted in the following figures.

Figure 6B:
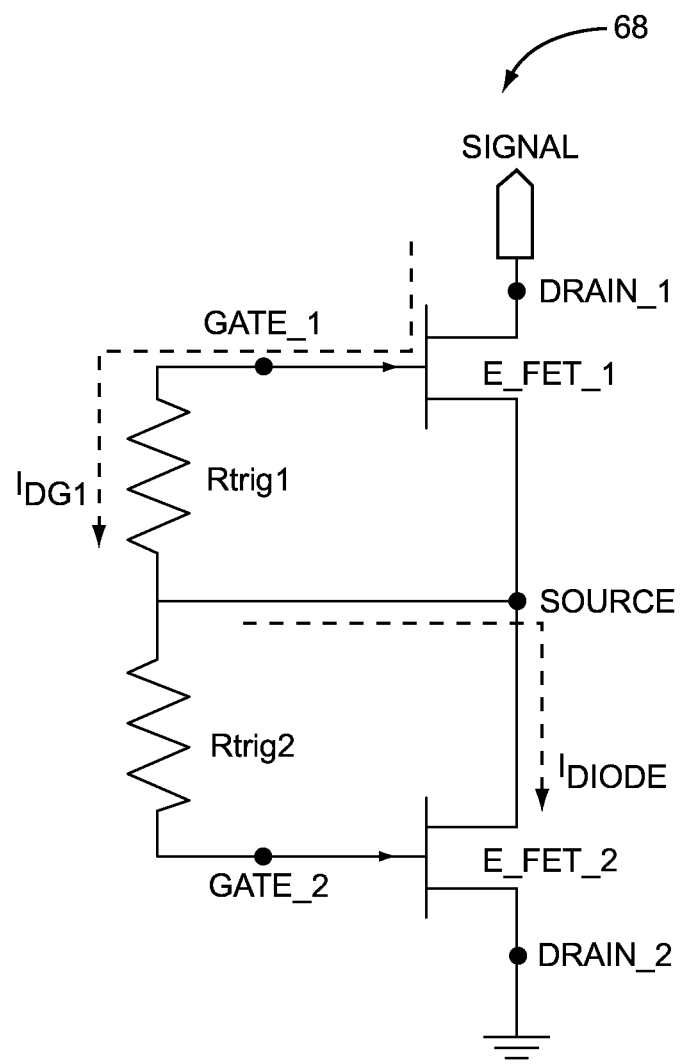
FIG. 6B illustrates a drain-gate breakdown current.

FIG. 6B illustrates a drain-gate breakdown current $I_{DG1}$. During a positive ESD event, as the SIGNAL voltage approaches (or exceeds) the drain-gate breakdown voltage (BVdgo1) of the first transistor, the leakage through the drain-gate junction of the first transistor increases, and a drain-gate breakdown current $I_{DG1}$ flows from DRAIN_1 to GATE_1, and then flows through resistor Rtrig11. As the voltage $V_{GS1}$ from GATE_1 to SOURCE increases beyond the threshold voltage Vth1 of the first transistor, the first transistor acts as a clamp.

In addition to triggering the clamp, the value of Rtrig1 needs to be large enough to prevent thermal runaway once the gate-drain junction of the first transistor breaks down.

A small portion of this drain-gate breakdown current $I_{DG1}$ flows through resistor Rtrig2 to GATE_2 to turn on the second transistor (which acts as a diode with a turn on voltage of Vth2), and the remainder (the majority) of this (ESD) current $I_{DG1}$ flows through the SOURCE and through the second transistor (which acts as a shunt) as $I_{DIODE}$.

Figure 6C:
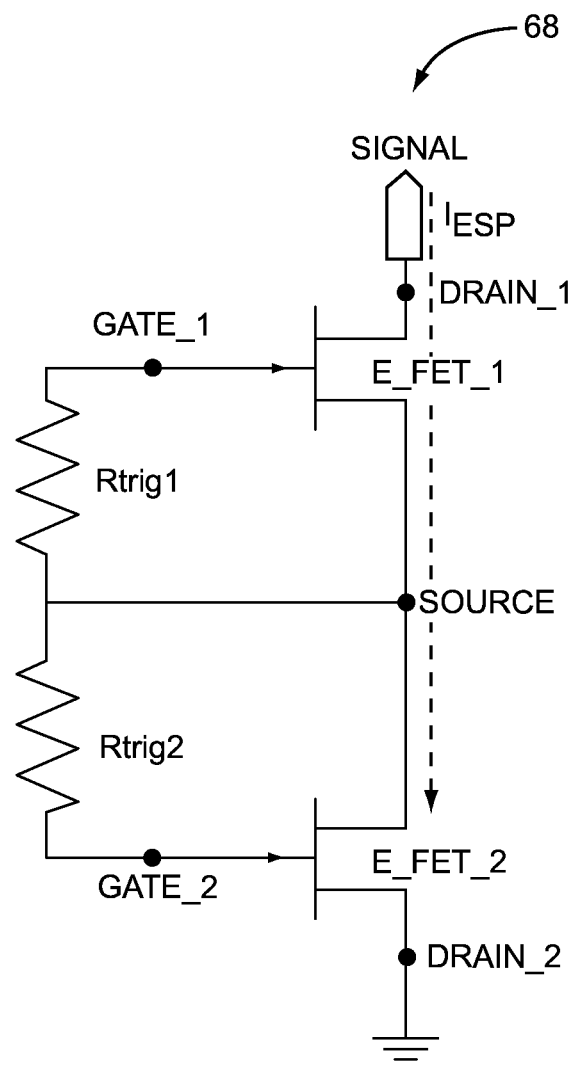
FIG. 6C illustrates an ESD (Electro-Static Discharge) current flow.

FIG. 6C illustrates an ESD current flow. The dual clamp device is triggered by a trigger voltage at the RF SIGNAL input of Vtrig=BVdgo1+Vth2. Preferably, the transistors are identical, and would have the same threshold voltage (Vth1=Vth2).

During a negative ESD event, the functionalities of the two transistors reverse.

Figure 6D:
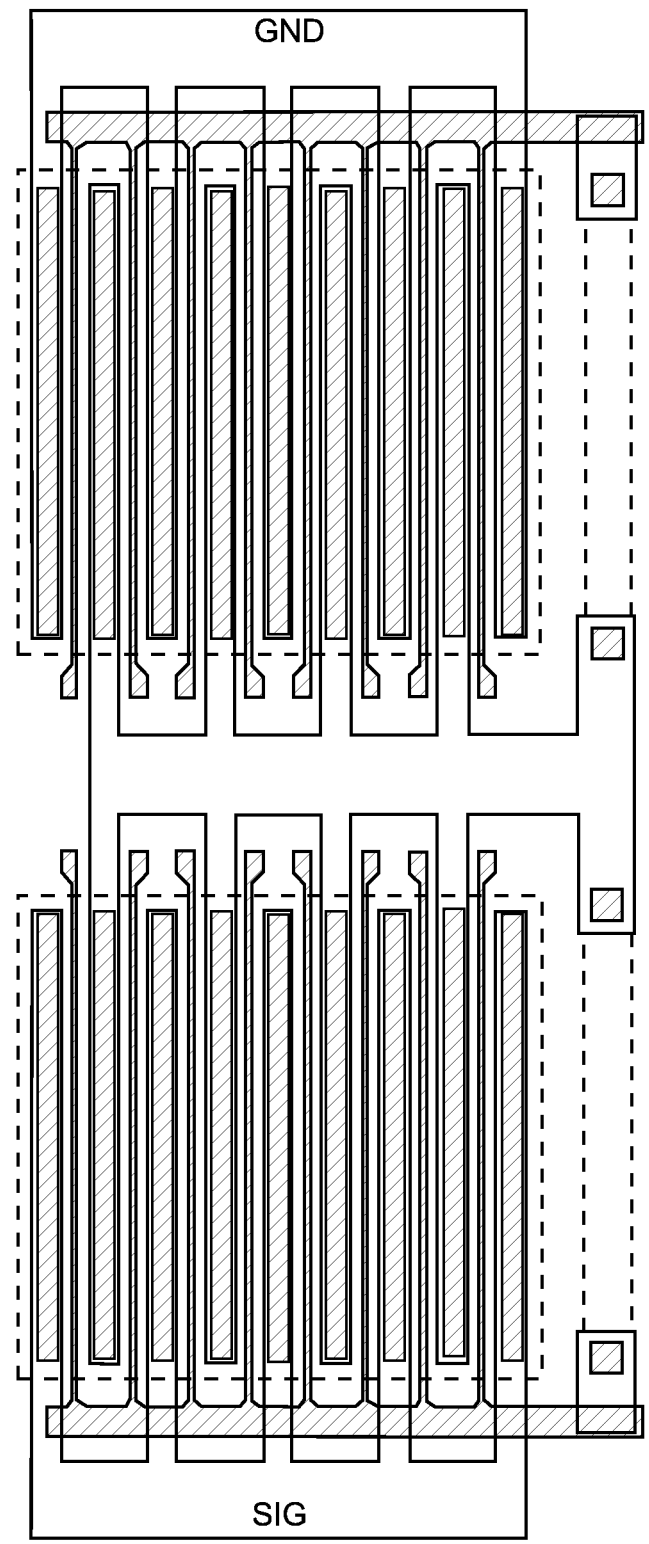
FIG. 6D is an illustrative dual clamp layout.

FIG. 6D is an illustrative dual clamp layout. An 8 finger, 52 μm gate width and 0.5 μm gate length device with A 1000Ω resistor ($R_{trig}$) was chosen to meet a 1000V Human Body Model (HBM) ESD requirement. These values are dependent upon the process and could be varied based on the ESD requirement and process parameters.

Figure 7A:
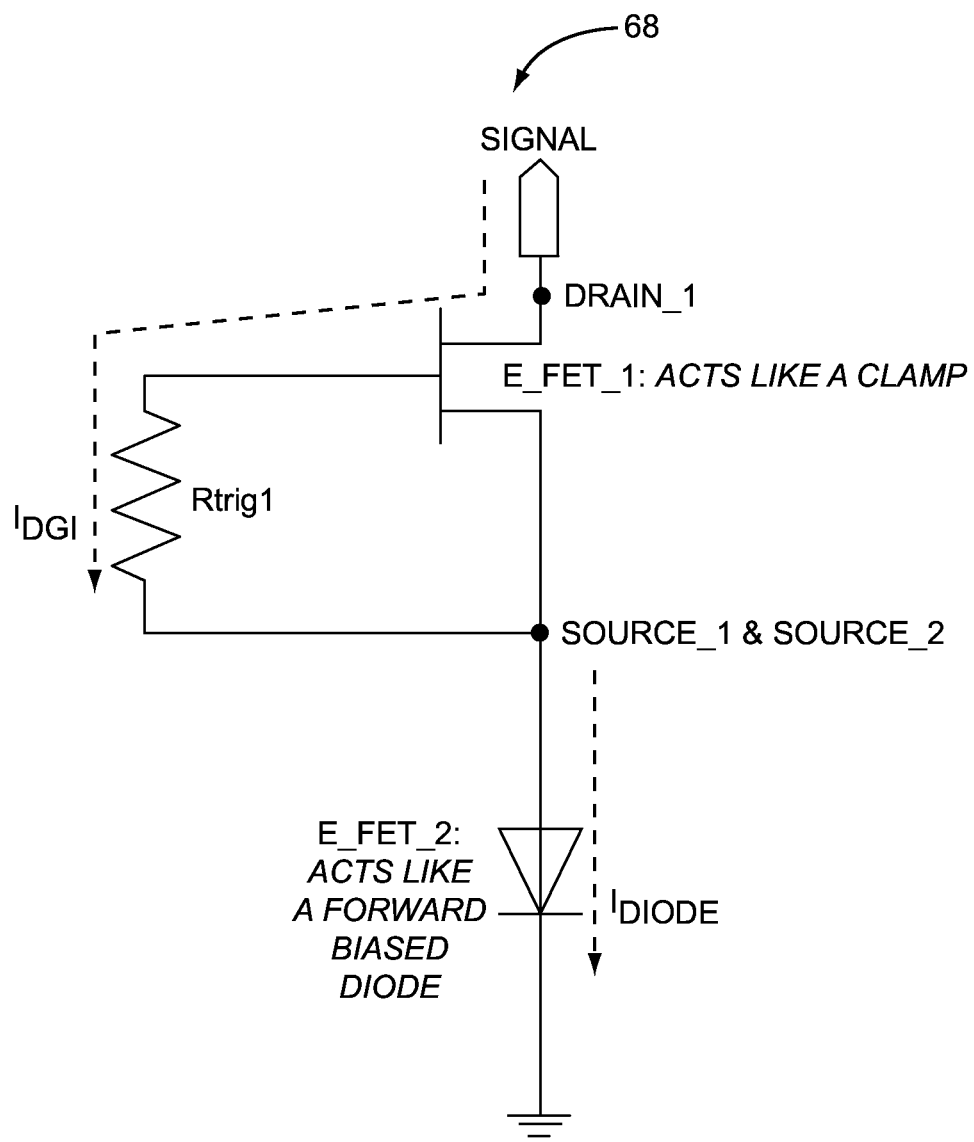
FIG. 7A is an illustrative dual clamp during a positive ESD event.

FIG. 7A is an illustrative dual clamp during a positive ESD event, and is similar to FIG. 6B, but more clearly illustrates that the first transistor acts as a clamp and the second transistor acts as a forward based diode.

Figure 7B:
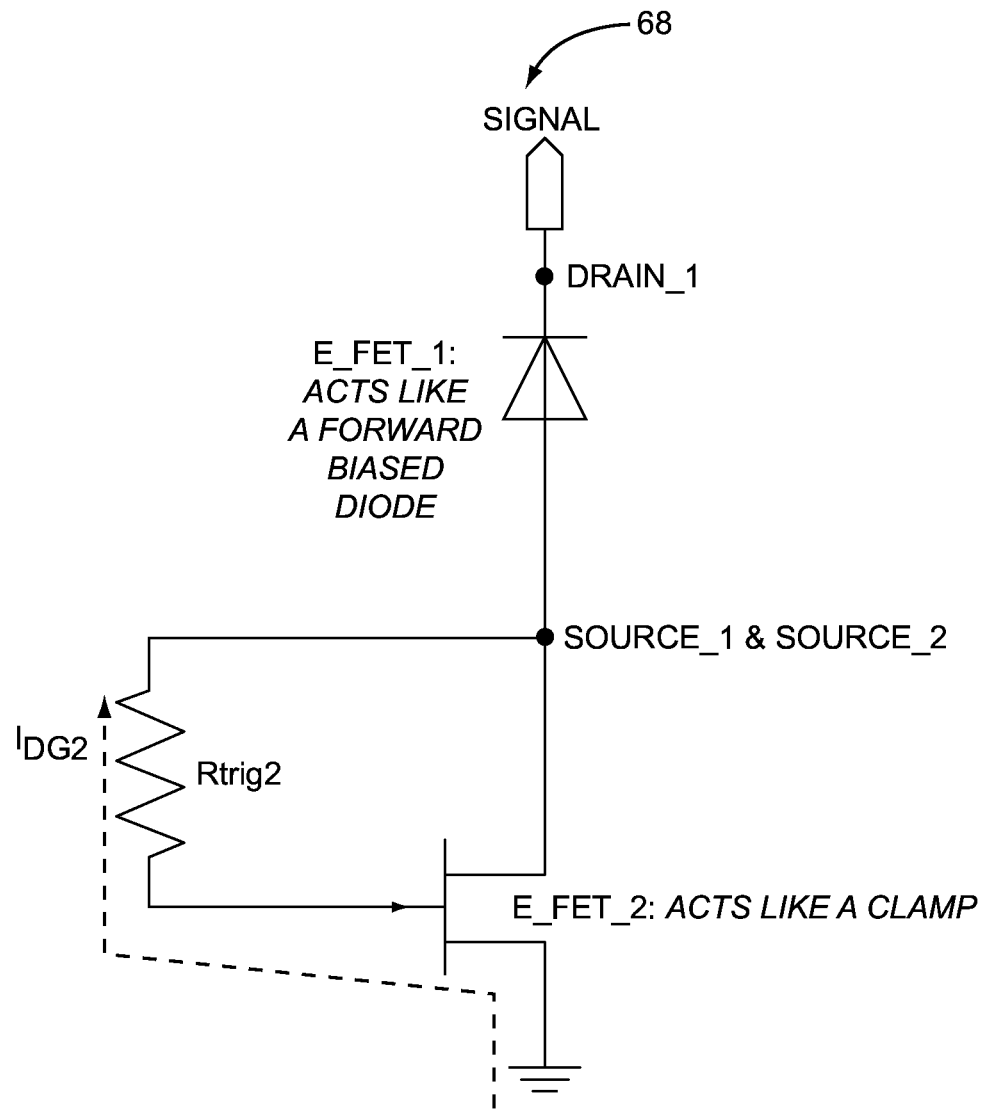
FIG. 7B is an illustrative dual clamp during a negative ESD event.

FIG. 7B is an illustrative dual clamp during a negative ESD event, and is similar to FIG. 7A except operating in reverse.

Figure 8A:
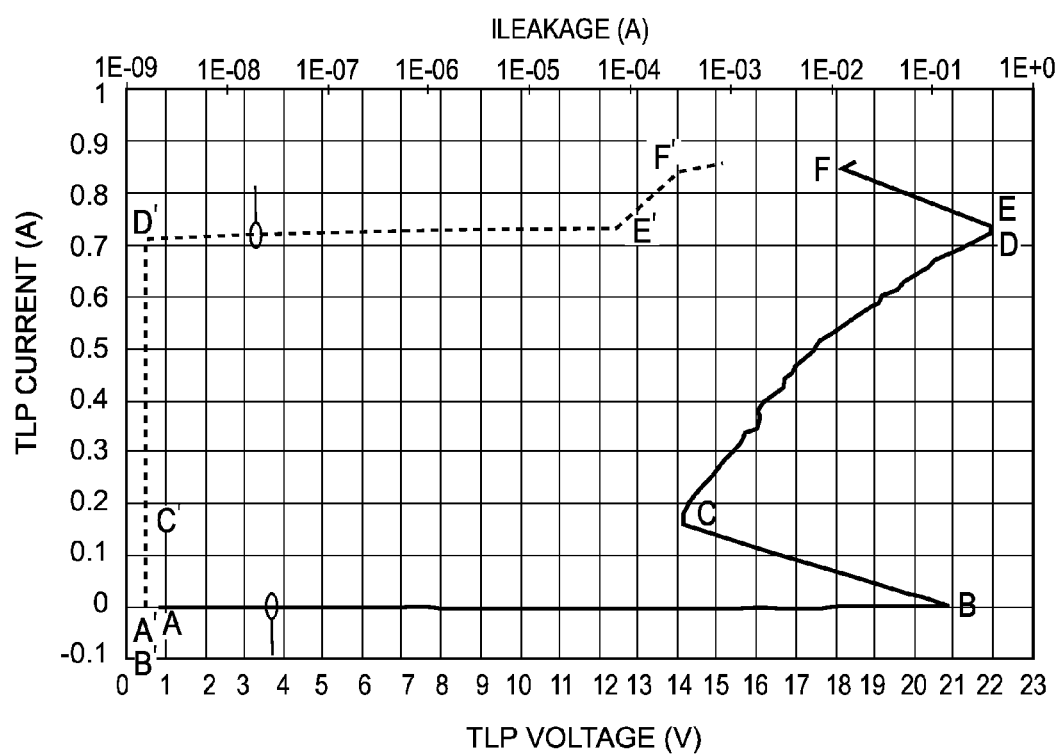
FIG. 8A illustrates positive TLP IV and leakage curves.

FIG. 8A illustrates positive TLP IV and leakage curves. A transmission line pulser (TLP) is a universally accepted ESD characterization tool which can monitor the voltage and current at the device under test (DUT) during an ESD event. A 10 ns rise-time, 100 ns pulse width square pulse was generated using the pulser. The above mentioned pulse width and rise time was chosen to mimic a Human Body Model (HBM) type ESD event.

Specifically, transmission line pulsing (TLP) test results from a standalone clamp structure (not connected to any RF processing circuit) are shown in FIG. 8A. The solid line indicates TLP current versus TLP voltage (bottom axis). The dashed line indicates TLP current versus leakage current (ILeakage). The dashed line is a constant current that is measured after every single pulse point to make sure that the structure is not destroyed.

Points A through E on the solid line correspond to points A' through E' on the dashed line, respectively.

Regarding the solid line, from A to B the TLP voltage (signal voltage or voltage at DRAIN_1) is increased from 1V to 21V (plotted in bottom X axis) and the corresponding TLP current is measured (plotted in Y-axis). Region A to B of the solid line (TLP curve) shows that as the voltage increases from 1V to 21V, the TLP current is close to 0 Amps (negligible) indicating that the structure is OFF. This denotes that any RF signal which has a voltage level less than 21V will NOT trigger the ESD structure. After every voltage step, a leakage test is performed on the ESD structure to determine if the structure is functional. This is shown by the dashed line A'-B'. The leakage current is plotted in top X-axis vs TLP current in Y-axis. Since TLP current did not change (almost 0 Amp) in region A-B, region A'-B' corresponds to single point, and the leakage current is 1E-9 Amp. At point B on the solid line, the clamp is triggered at about 21 V.

Points B to C in the solid line correspond to "snap-back region" points B' to C' in the dashed line. When the TLP voltage exceeds 21V, the structure turns ON, snaps back and clamps the voltage to 14V (point C). After every single test point between B and C, a leakage test is performed and is shown in B'-C' region of the dotted line. The leakage current does not change (remains around 1E-9) indicating the device or structure is still functional.

Points C to D in the solid line correspond to points C' to D' in the dashed line. Once the device turns ON, as the test voltage is increased, the TLP current increases and there is a marginal increase in TLP voltage until the device's maximum current handling capability (which depends on the size of the device) is reached.

Points D to E in the solid line correspond to points D' to E' in the dashed line. Failure of the clamp occurs at points E and E'. For this particular device size, region D corresponds the maximum current handling of the structure and hence signifies the TLP current handling of this particular structure. This structure was specifically designed to meet 1000V HBM ESD rating. The TLP current rating required to meet 1000V HBM rating is approximately 0.67 A. The size of the FETs can be increased/decreased to change the TLP current handling (and the ESD rating) of the structure.

Figure 8B:
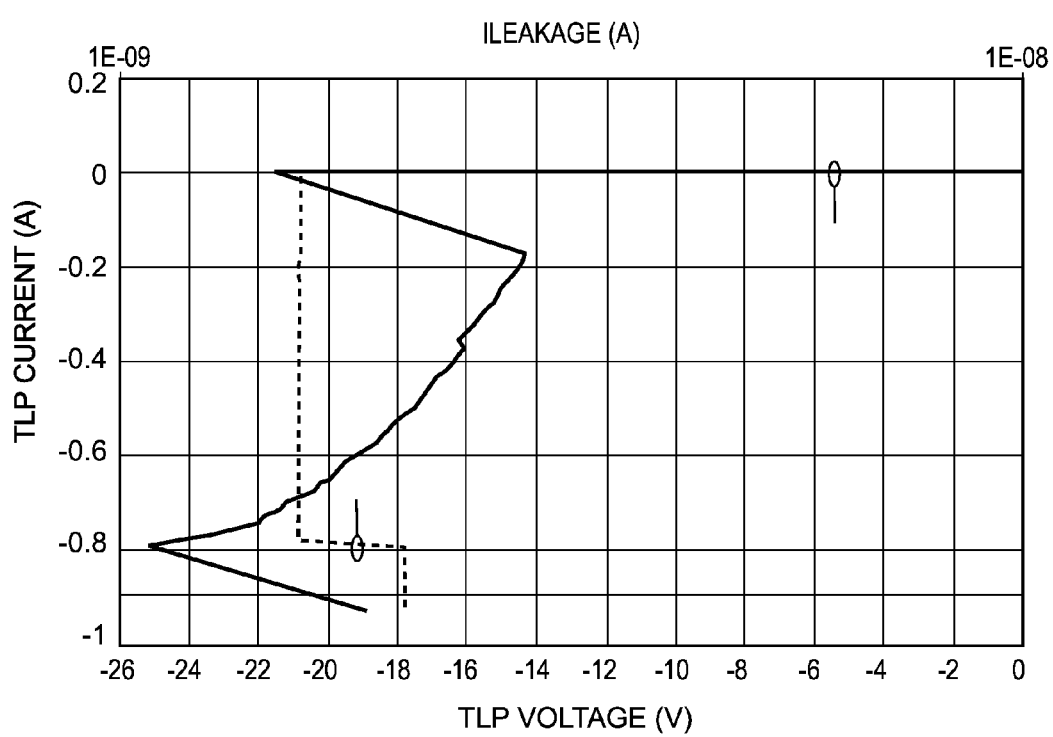
FIG. 8B illustrates negative TLP IV and leakage curves.

As expected, the pulsed IV curves are similar for positive and negative ESD events (see FIG. 8B in comparison to FIG. 8A). Leakage measurements were performed at a constant DC voltage after every single TLP pulse voltage. Any shift in the DC leakage current is considered as a device failure. The TLP current level at which the failure occurs determines the TLP current handling of the clamp. The structure has a trigger voltage of ±21V and can handle ±0.7 A of TLP current. The measured HBM rating of this structure is 1400V. As mentioned earlier, the trigger voltage is process dependent and the size of the FETs could be varied to obtain the desired ESD protection level.

FIG. 8B illustrates negative TLP IV and leakage curves. FIG. 8B is similar to FIG. 8A, but for a negative ESD event.

Loading capacitance is a very important parameter defining an ESD structure. Since the proposed structure has two clamps in series, the effective capacitance of the ESD structure is half of the capacitance of each clamp.

The channel is OFF during normal operation and hence the drain-source capacitance ($C_{ds}$) for each clamp is low. For each clamp, the gate-source ($C_{gs}$) and gate-drain ($C_{gd}$) fringing capacitance are in series which reduces the overall capacitance for each clamp. The above capacitances ($C_{ds}$, $C_{gs}$, and $C_{gd}$) are capacitances for a single transistor or clamp.

Figure 9:
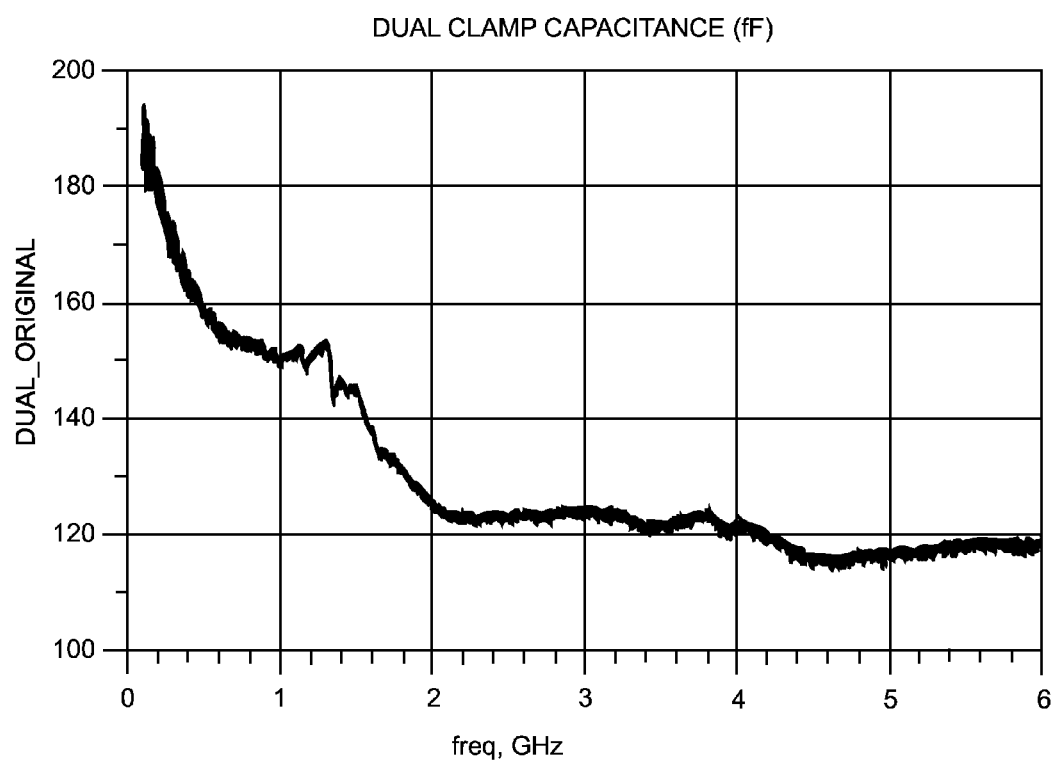
FIG. 9 illustrates the capacitance of an unbiased dual clamp as a function of frequency.

FIG. 9 illustrates the capacitance of an unbiased dual clamp as a function of frequency. There is generally a reduction in the capacitance at higher frequencies, but for frequencies beyond 2 GHz the capacitance of the dual clamp is fairly constant (around 120 fF). This constancy is an important property because non-linearities in system performance are caused mainly due to the change in capacitance over frequency. Thus, this illustrative dual clamp provides relatively constant capacitance from 2 GHz to 6 GHz. The inventors use the term "dual clamp" to describe this structure, because one of the transistors functions as a clamp for a positive ESD event, and the other transistor functions as a clamp during a negative ESD event.

Figure 10:
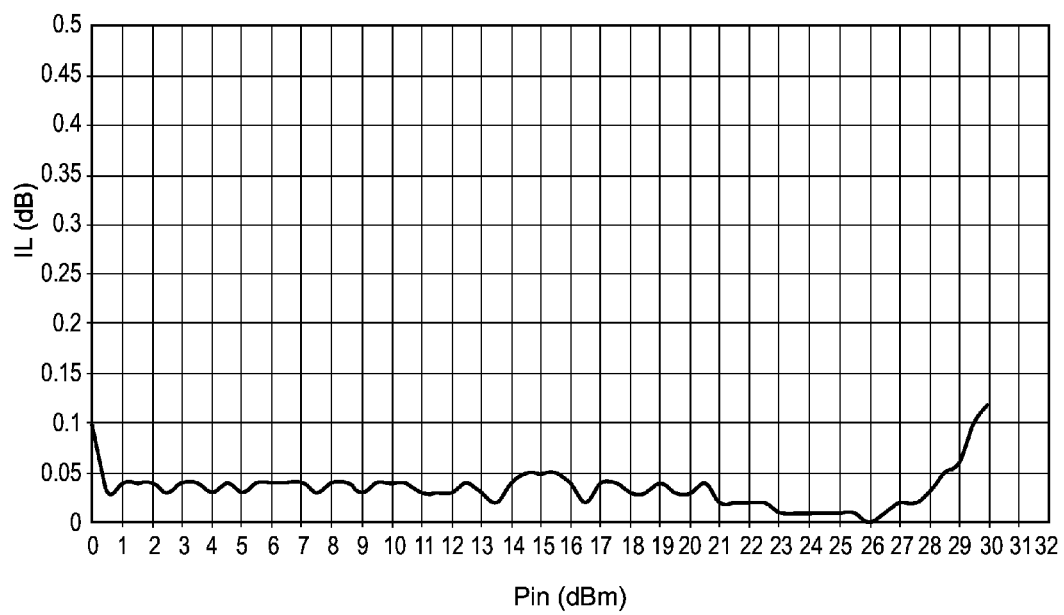
FIG. 10 illustrates the insertion loss as a function of power.

FIG. 10 illustrates the insertion loss as a function of power. Specifically, FIG. 10 shows the insertion loss as a function of power of the standalone dual clamp measured at matched (50Ω) conditions. FIG. 10 does not show the compression point because the test setup could not (at that time) apply an RF signal >30 dBm. As the power level increases, the voltage swing increases. Once the voltage swing exceeds the trigger voltage of the clamp, the clamp would turn ON and start clipping the RF signal. The structure was added to Pout node of a product (RF5611), and therefore the power was labeled Pout (although it is actually Pin relative to the structure). FIG. 10 indicates that the standalone clamp does not turn ON up to 30 dBm during a continuous wave (CW) power sweep.

For a Front End Module (Low Noise Amplifier with a SP3T switch), the maximum power rating of the WLAN Transmit (TX) port of the switch is 30 dBm.

Figure 11:
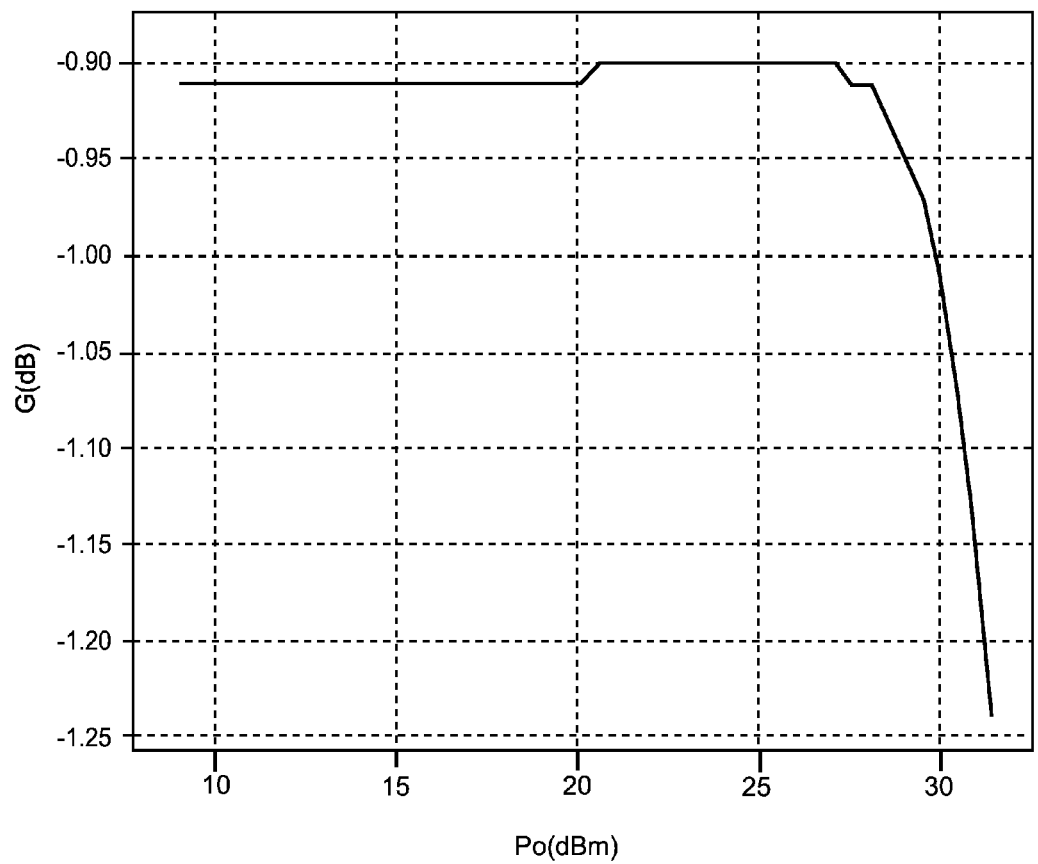
FIG. 11 illustrates the insertion gain as a function of power.

FIG. 11 illustrates the insertion gain as a function of power. Specifically, FIG. 11 shows the large signal insertion loss from the TX to Antenna (ANT) port. Power sweep data shows that the clamp does not compress even at 30 dBm. This baseline die was laid out without ESD protection and compared with another die where the ESD clamp structure was added to the TX port. Insertion loss is a positive number. For example, 0.9 dB insertion loss means the signal is degraded by 0.9 dB.

Figure 12A:
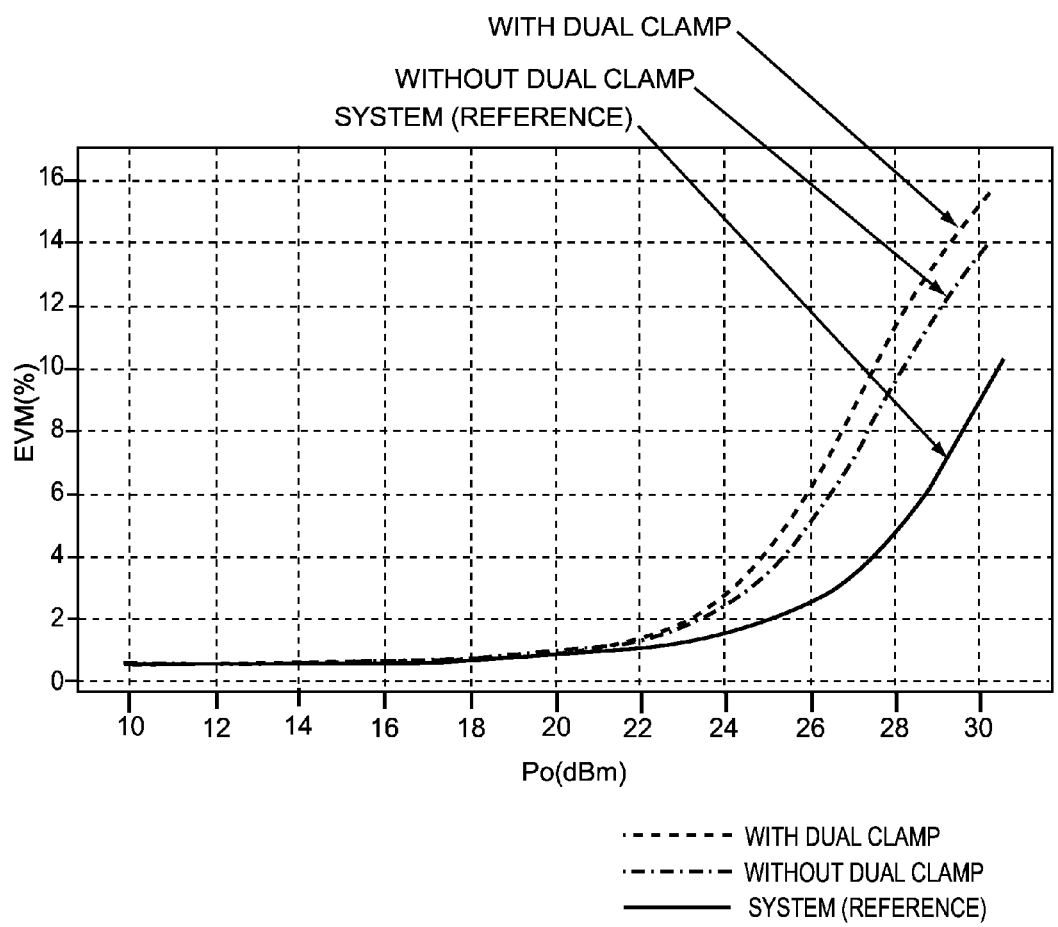
FIG. 12A illustrates EVM (Error Vector Magnitude) as a function of power.

FIG. 12A illustrates a linearity metric EVM (Error Vector Magnitude) as a function of power. The clamp has marginal impact on the EVM linearity metric.

Figure 12B:
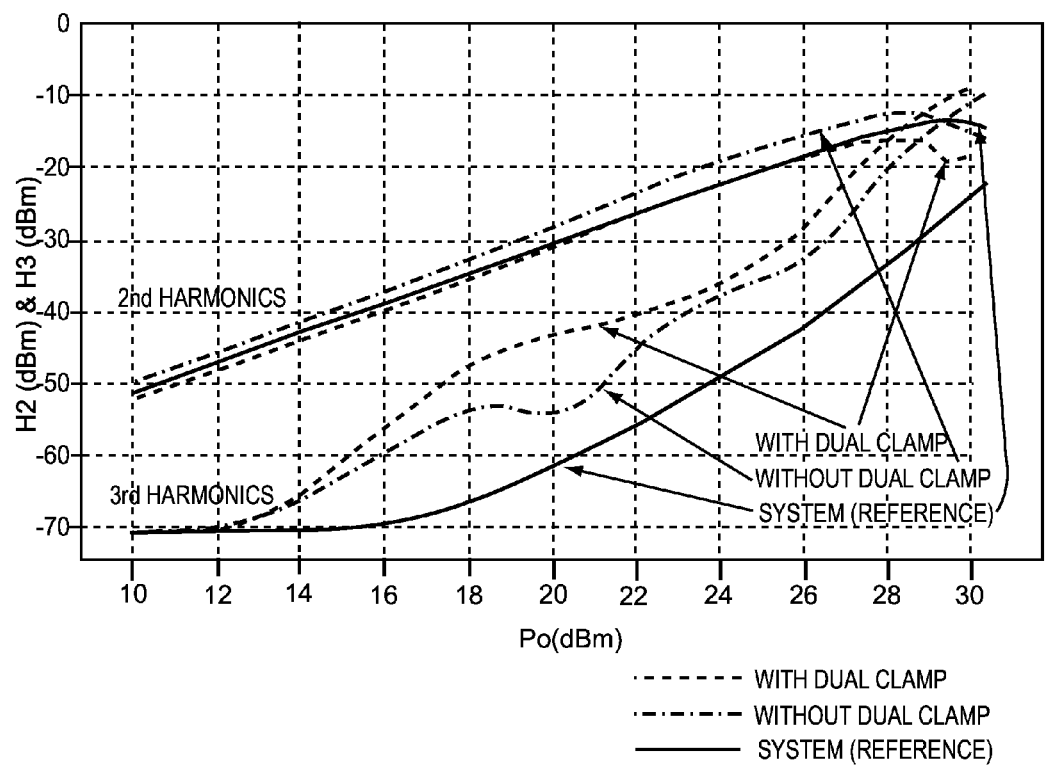
FIG. 12B illustrates second and third harmonics as a function of power.

FIG. 12B illustrates second and third harmonics as a function of power, with and without the dual clamp. The dual clamp has marginal impact on the linearity metrics of second and third harmonics.

Figure 13A:
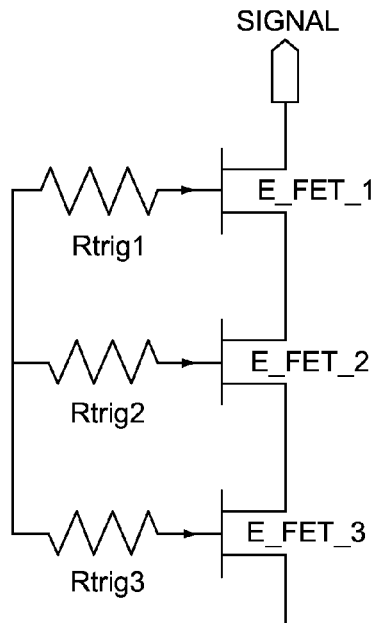
FIGS. 13A through 13D illustrate various embodiments of the present disclosure.

FIG. 13A though 12D illustrate various embodiments of the present disclosure. In FIG. 13A, multiple clamps are added in series to increase the effective trigger voltage. This increases the maximum power handling of the clamp.

Figure 13B:
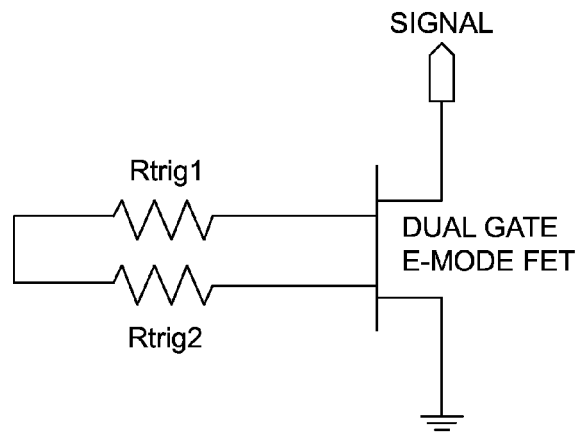
Figure 13C:
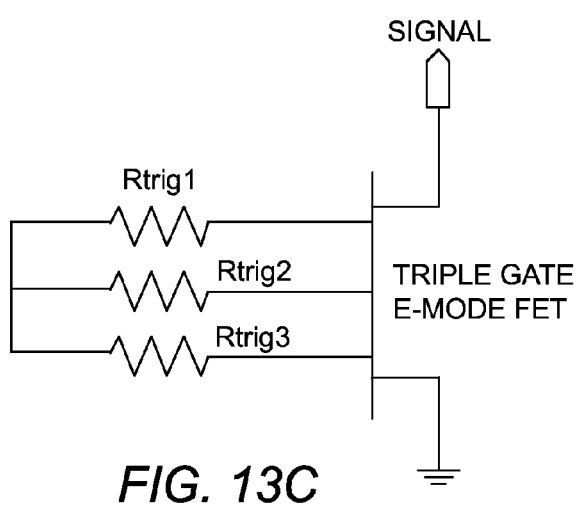
Figure 13D:
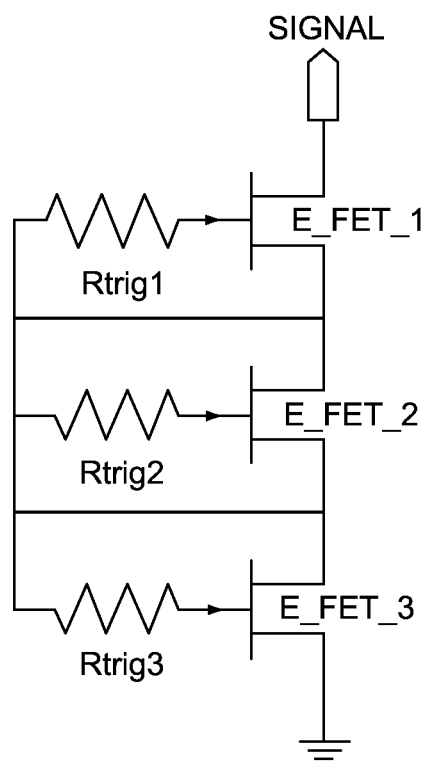

In FIG. 13B, a dual gate FET is used. In FIG. 13C, a triple gate FET is used. Multiple gate FETs may be more area efficient when compared with series connected back to back single clamps. In FIG. 13D, multiple claims are added in series to increase the effective trigger voltage. All such variations are considered within the scope of the present disclosure.

Those skilled in the art will recognize improvements and modifications to the preferred embodiments of the present disclosure. All such improvements and modifications are considered within the scope of the concepts disclosed herein and the claims that follow.

What is claimed is:
1. Antenna switching circuitry comprising:
a plurality of communication ports;
an antenna port;
a plurality of switches configured to selectively couple one or more of the plurality of communication ports to the antenna port; and
a plurality of ESD protection devices each directly coupled between a different one of the plurality of communication ports and ground, wherein there is a greater number of communication ports than ESD protection devices in the antenna switching circuitry and each one of the plurality of ESD protection devices comprises:
a first transistor including a drain contact coupled to one of the plurality of communication ports, a source contact, and a gate contact coupled to the source contact through a first resistor; and
a second transistor including a drain contact coupled to the source contact of the first transistor, a source contact coupled to ground, and a gate contact coupled to the drain contact through a second resistor.

2. The antenna switching circuitry of claim 1 wherein each of the plurality of ESD protection devices are configured to form a substantially low impedance path to ground during an ESD event, while maintaining a substantially high impedance path to ground during a non-occurrence of an ESD event.

3. The antenna switching circuitry of claim 1 wherein during an ESD event, the antenna switching circuitry is configured to pass an ESD signal received at any of the plurality of communication ports to at least one of the plurality of ESD protection devices.

4. The antenna switching circuitry of claim 3 wherein during an ESD event, the antenna switching circuitry is further configured to pass an ESD signal received at the antenna port to at least one of the plurality of ESD protection devices.

5. The antenna switching circuitry of claim 1 further comprising control circuitry configured to control the state of each one of the plurality of switches.

6. The antenna switching circuitry of claim 1 wherein the plurality of ESD protection devices are coupled to the least sensitive ones of the plurality of communication ports.

7. The antenna switching circuitry of claim 6 wherein the least sensitive ones of the plurality of communication ports are the plurality of communication ports that receive lower power signals.

8. The antenna switching circuitry of claim 1 wherein each one of the switches in the plurality of switches are depletion mode field effect transistors (FETs).

9. The antenna switching circuitry of claim 1 wherein each of the plurality of ESD protection devices is configured to turn ON when a voltage at the drain contact of the first transistor is equal to or greater than a positive trigger voltage, and is configured to turn ON when the voltage at the drain contact of the first transistor is less than or equal to a negative trigger voltage.

10. The antenna switching circuitry of claim 1 wherein the first transistor and the second transistor are pseudomorphic high electron mobility transistors (pHEMTs).

11. The antenna switching circuitry of claim 10 wherein the first transistor and the second transistor are enhancement mode transistors.

12. The antenna switching circuitry of claim 11 wherein the second transistor is substantially identical to the first transistor, and a positive trigger voltage is substantially equal and opposite to a negative trigger voltage.

13. Front end circuitry comprising:
antenna switching circuitry comprising:
a plurality of communication ports;
an antenna port;
a plurality of switches configured to selectively couple one or more of the plurality of communication ports to the antenna port; and
a plurality of ESD protection devices each directly coupled between a different one of the plurality of communication ports and ground, wherein there is a greater number of communication ports than ESD protection devices in the antenna switching circuitry and each one of the plurality of ESD protection devices comprises:
a first transistor including a drain contact coupled to one of the plurality of communication ports, a source contact, and a gate contact coupled to the source contact through a first resistor; and
a second transistor including a drain contact coupled to the source contact of the first transistor, a source contact coupled to ground, and a gate contact coupled to the drain contact through a second resistor;
an antenna coupled to the antenna port through a diplexer;
transmit circuitry coupled to the one or more communication ports in the plurality of communication ports;
receive circuitry coupled to the one or more communication ports in the plurality of communication ports, such that the transmit circuitry and the receive circuitry are coupled to different communication ports in the plurality of communication ports; and
control circuitry configured to control the state of each one of the plurality of switches.

14. The antenna switching circuitry of claim 13 wherein each of the plurality of ESD protection devices are configured to form a substantially low impedance path to ground during an ESD event, while maintaining a substantially high impedance path to ground during the non-occurrence of an ESD event.

15. The antenna switching circuitry of claim 13 wherein during an ESD event, the antenna switching circuitry is configured to pass an ESD signal received at any of the plurality of communication ports to at least one of the plurality of ESD protection devices.

16. The antenna switching circuitry of claim 15 wherein during the ESD event, the antenna switching circuitry is further configured to pass an ESD signal received at the antenna port to at least one of the plurality of ESD protection devices.

17. The antenna switching circuitry of claim 13 wherein the plurality of ESD protection devices are coupled to the least sensitive ones of the plurality of communication ports.

18. The antenna switching circuitry of claim 17 wherein the least sensitive ones of the plurality of communication ports are the plurality of communication ports that receive lower power signals.

19. RF switching circuitry comprising:
a first plurality of communication ports;
a second plurality of communication ports;
a plurality of switches configured to selectively couple one or more of the first plurality of communication ports to one or more of the second plurality of communication ports; and
a plurality of ESD protection devices each directly coupled between a different one of the first plurality of communication ports and ground, wherein there is a greater number of communication ports than ESD protection devices in the RF switching circuitry and each one of the ESD protection devices comprises:
a first transistor including a drain contact coupled to one of the plurality of communication ports, a source contact, and a gate contact coupled to the source contact through a first resistor; and
a second transistor including a drain contact coupled to the source contact of the first transistor, a source contact coupled to ground, and a gate contact coupled to the drain contact through a second resistor.

20. Antenna switching circuitry comprising:
a plurality of communication ports;
an antenna port;
a plurality of switches configured to selectively couple one or more of the plurality of communication ports to the antenna port; and one or more ESD protection devices each coupled between a different one of the plurality of communication ports and ground, each of the one or more ESD protection devices comprising:
- a first transistor including a drain contact coupled to one of the plurality of communication ports, a source contact, and a gate contact coupled to the source contact through a first resistor; and
- a second transistor including a drain contact coupled to the source contact of the first transistor, a source contact coupled to ground, and a gate contact coupled to the drain contact through a second resistor.

\* \* \* \* \*